United States Patent [19]

Haeusele

[11] Patent Number: 4,463,450
[45] Date of Patent: Jul. 31, 1984

[54] SEMICONDUCTOR MEMORY FORMED OF MEMORY MODULES WITH REDUNDANT MEMORY AREAS

[75] Inventor: Hans Haeusele, Munich, Fed. Rep. of Germany

[73] Assignee: Siemens Aktiengesellschaft, Berlin & Munich, Fed. Rep. of Germany

[21] Appl. No.: 292,339

[22] Filed: Aug. 12, 1981

[30] Foreign Application Priority Data

Aug. 29, 1980 [DE] Fed. Rep. of Germany ....... 3032630

[51] Int. Cl.³ ............................................. G11C 11/40
[52] U.S. Cl. ...................................... 365/200; 371/10
[58] Field of Search ......................... 371/9, 10, 11, 21; 365/200, 201, 210

[56] References Cited

U.S. PATENT DOCUMENTS 3,755,791 8/1973 Arzubi .................................. 365/200
4,047,163 9/1977 Choate et al. .......................... 371/10

OTHER PUBLICATIONS

IBM Technical Disclosure Bulletin, vol. 15, No. 6, Nov. 1972, W. F. Beausoleil, "Utilization of Defective Memory Chips by Substituting Redundant Words for Defective Words".
IBM Technical Disclosure Bulletin, vol. 25, No. 3A, Aug. 1982, Chan et al., "Array Word Redundancy Scheme".

Japanese Laid-Open Application No. 52-33431, Mar. 1977.
"Multiple Word/Bit Line Redundancy for Semiconductor Memories", by Stanley Schuster, IEEE Journal of Solid-State Circuits, vol. SC13, No. 5, Oct. 1978, pp. 698–703.
"Memory Data Book and A Designers Guide", Publication of Mostek Corp., Carollton, U.S.A., Feb. 1978, pp. 107–116, Module MK4116.

Primary Examiner—Joseph A. Popek
Attorney, Agent, or Firm—Hill, Van Santen, Steadman & Simpson

[57] ABSTRACT

A semiconductor memory has a plurality of modules or boards each with a plurality of memory integrated circuits and redundant memory areas. For receiving of information for replacement circuiting of faulty bit locations in a memory circuit with redundant memory areas, a volatile auxiliary memory is provided in the memory circuit. Each structural unit, which is easily exchangeable in the course of maintenance jobs which encompass a plurality of memory circuits such as a printed circuit board, has associated with it a programmable non-volatile read-only memory for receiving the replacement circuit information for all memory circuits which are combined in the structural unit. The programming of the read-only memory preferably proceeds during testing of the structural unit.

6 Claims, 2 Drawing Figures

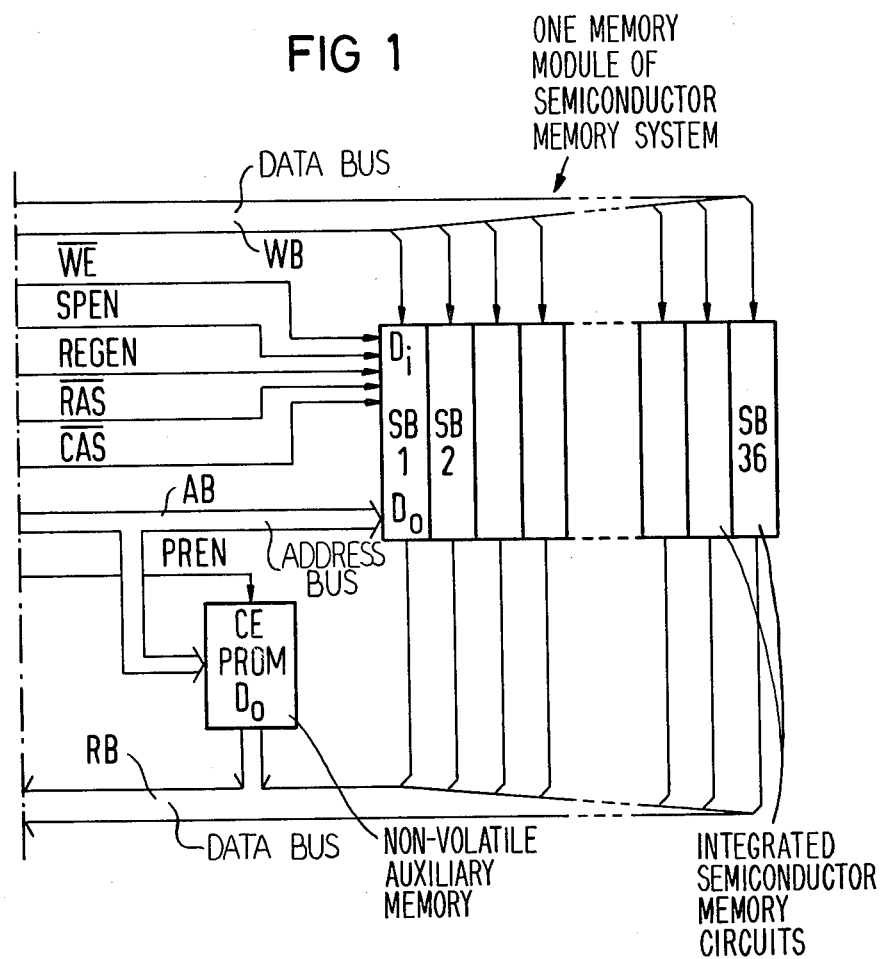

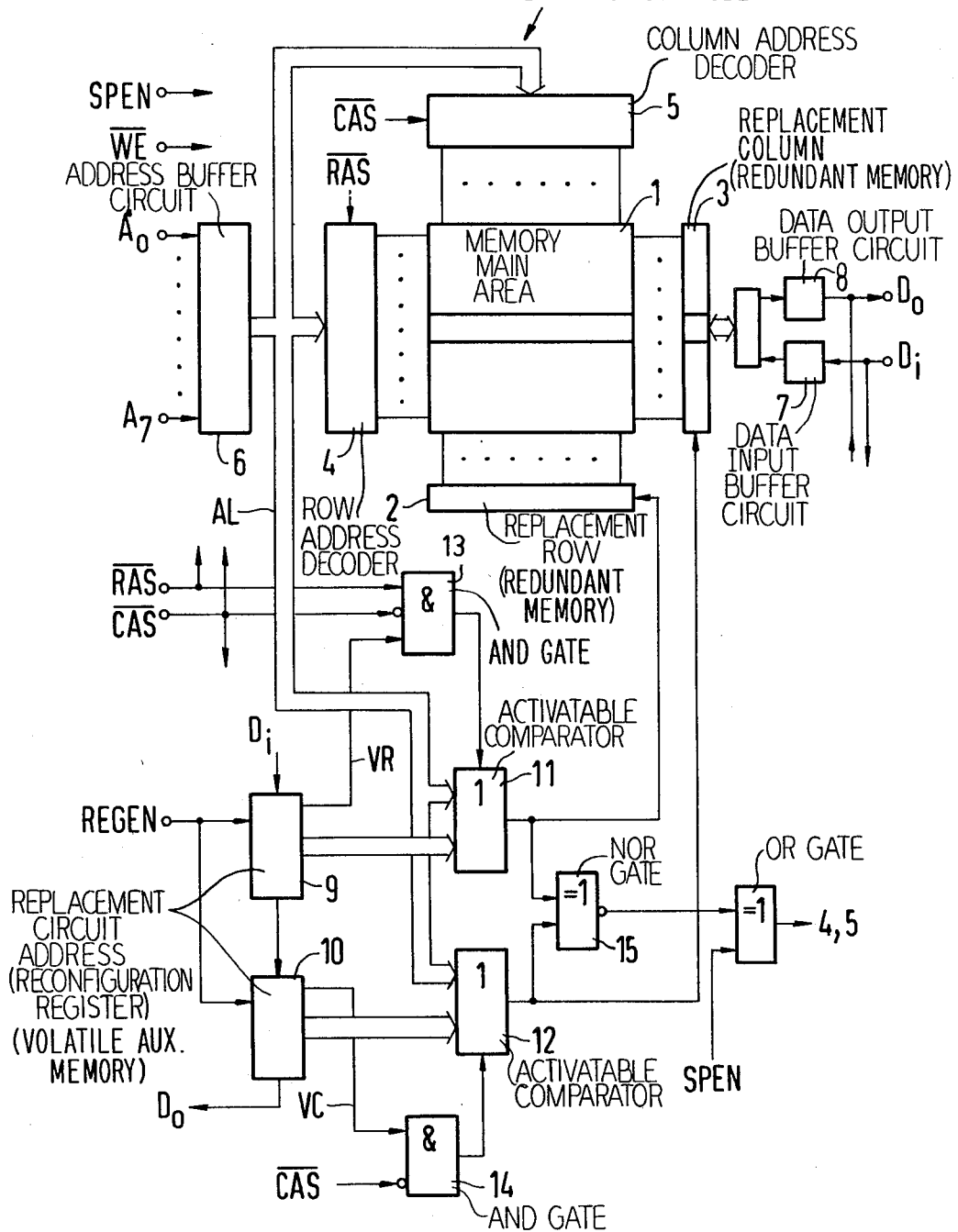

SEMICONDUCTOR MEMORY FORMED OF MEMORY MODULES WITH REDUNDANT MEMORY AREAS

BACKGROUND OF THE INVENTION

The invention concerns a semiconductor memory modules having individual memory circuits with redundant memory areas. Devices are provided for replacement circuiting of faulty memory areas of the memory modules by the redundant memory areas. Specifically, an internal memory circuit volatile auxiliary memory or reconfiguration register is provided for receiving information required for the replacement circuiting. Also, an external memory module non-volatile auxiliary memory is provided for receiving information necessary for internal replacement circuiting of all memory circuits.

Memory systems on a semiconductor base are presently constructed with the use of integrated memory modules. Accordingly, for each memory module a number of memory circuits (for example 36) are combined on a plug-in circuit board or on an assembly unit to form the memory module which is easily exchangeable for testing or maintenance purposes. Depending upon the desired capacity of the total memory and the capacity of the memory modules, or respectively of the circuit boards, the total memory is comprised of a more or less large plurality of circuit boards or modules. In general, the memory is also equipped with a fault or error correction device.

A very serious problem in the manufacture of integrated memory circuits is the low yield of completely fault or error free memory circuits. One has thus sought possibilities of at least still being able to employ such partially functional memory circuits whose faults only relate to individual bit locations, or respectively only a few rows or columns. However, such techniques result in a decreased capacity of the total memory with respect to a capacity which is attainable with fault-free memory circuits or they may result in an overload of the fault correction device.

It has thus already been proposed to arrange on a circuit board a group of, for example 16 memory circuits which may be effected by faults, without redundant memory areas and which results in a fault or error free memory circuit. The additional memory circuit takes over the replacement of the faulty bit locations in the group of circuits. A programmable read-only memory is addressed by means of a circuit selection address and the column address and, corresponding to its programmed conversion or translation function, releases an address for the replacement or substitute module when the primary address designates a faulty bit location. The circuit selection decoder for the circuit group is then blocked.

The expense of the programmable read-only memory is very high. In the case of 16 memory circuits with in each case 16k bits, for example, it would have to incorporate for example 2048 addressable memory locations for possible replacement addresses, of which naturally only a few can be occupied. Besides this, the data interface of the memory board circuit can only be as wide as the data interface of the additional memory circuit.

It is known from U.S. Pat. No. 3,755,791 incorporated herein by reference, to provide on the memory chip next to a first larger memory area a second significantly smaller memory area. Since in the case of freedom from fault, the first memory area is only accessed and its capacity is defined as the capacity of the memory chip, or respectively the memory circuit, this area will be designated hereafter as the memory main area. Correspondingly, the second area is the redundant memory area or memory replacement area. Its task is, to the greatest extent possible, to replace defective memory cells or word or bit lines in the memory main area. For the replacement circuit in the case of the known arrangement, on the memory chip changeover, devices and a programmable read-only memory are present for the storage of the information required therefore.

In case of the insertion of a printed circuit board with memory circuits of this type, the width of the data interface from and to the PC board can encompass as a maximum just as many bits as memory circuits which are present.

A survey of further possibilities for the complete use of faulty memory circuits with redundancy is given in the literature selection "IEEE Journal of Solid-State Circuit". Vol. SC-13, No. 5, October 1978, pages 698–703, incorporated herein by reference. Among other things, observations are made in this article concerning different kinds of storage of the replacement circuit information. Cited as an example is "the storage" by means of performing an operation on the wiring on the semiconductor chip by means of laser beams during or after a first check or inspection of the chip. As a further example, the programmable read-only memory already mentioned is cited. Both kinds have the advantage that the stored information does not get lost when the operating voltage for the memory circuit or for the memory constructed of such circuits is disconnected. While the first method however is very unflexible and subsequently does not permit change, the preparation of a programmable read-only memory on the chip in general requires the use of a technology which deviates from the technology for the production of the customary arrangements on the chip.

These disadvantages can be avoided by means of a volatile auxiliary memory on the memory chip whose content in any case disappears when the operating voltage fails. In order to avoid again checking the entire memory following this for the recovery of the appropriate information, in the literature selection mentioned it is proposed to provide a read-only memory for the entire memory, for example a magnetic disc. If, however, in case of a need for maintenance, a printed circuit board must be exchanged, the read-only memory contains information which is not valid for the replacement printed circuit board. The memory must therefore be again checked out.

SUMMARY OF THE INVENTION

The invention is based upon the problem of changing the known arrangement so that the memory circuits contain volatile auxiliary memories (registers) for the acceptance of the replacement circuit information. A read-only memory is also associated with the complete memory module. With this system, the exchanging of printed circuit boards or comparable very small structural units when the need for maintenance arises can be accomplished without special circumstances, and without a following check out of the memory for the purpose of recovery of the necessary equivalent circuit information for the corresponding structural units.

According to the invention, this problem is solved by associating with each smallest structural unit which is exchangeable in the course of normal maintenance procedures, a programmable read-only memory provided as the non-volatile auxiliary memory. The read-only memory receives the replacement circuit information for all memory circuits which are combined on the structural unit.

BRIEF DESCRIPTION OF THE DRAWINGS

FIG. 1 shows in block diagram format the organization of a memory printed circuit board (memory module) according to the invention; and FIG. 2 shows in block diagram format the circuitry principle of a memory circuit SB1, for example, of the memory module of FIG. 1 and having redundant memory areas.

DESCRIPTION OF THE PREFERRED EMBODIMENTS

For the following, it is assumed, for example, that a memory printed circuit board or module contains 36 integrated memory circuits with a 1 bit wide data interface. Access is had to all integrated memory circuits in parallel. In accordance therewith, the intersection of the printed circuit board for writing data and reading data in each case encompasses 36 bits. If one also assumes that the memory circuits have a capacity (in the memory main region) of 65k-bits and the column address is input after the row address, then the address bus has a width of 8 bits. Other forms of organization are of course possible whereby, where applicable, another memory circuit selection address must be provided.

FIG. 1 shows the circuitry of a memory printed circuit board or module with several of the 36 memory circuits SB1 through SB36 whose write data inputs and read data outputs in each case form a data bus WB or, respectively, RB. All memory circuits lie parallel on the address bus AB. Furthermore, a programmable read-only memory PROM is present which is connected with the address bus AB and the read data bus RB. The read-only memory PROM contains the information for the replacement or substitute circuit for faulty parts of the memory main areas by means of the memory replacement areas in all memory circuits of the memory printed circuit board or module. These items of information are input during checking of the memory printed circuit board or module, or following the checking.

FIG. 1 also shows the connections for the writing-reading selection signal $\overline{WE}$ and for the release signals SPEN, REGEN and PREN, the significance of which will be discussed hereafter. Furthermore, the inputs for the control signals $\overline{RAS}$ and $\overline{CAS}$ for control of the chronologically stepped or graduated input of row and column addresses are illustrated.

FIG. 2 shows the simplified circuitry principle of a memory circuit with the matrix-formed memory main area 1 of a customary type, as well as a replacement row 2 and a replacement column 3, which together form the memory replacement area. Also, in each case several replacement rows and replacement columns can be provided. For the selection of a specific row and column in the memory main area, the row address decoder 4 and the column address decoder 5 are used. At least the row address decoder 4 must have memory characteristics because of the address input operations which are consecutive in time for row and column. The input of the address bits $A_0$ through $A_7$ takes place via an address buffer circuit 6 from which the addresses are passed onward via the address lines AL. A bit, which is to be written in during access to the memory circuit, proceeds via the data input $D_i$ and data input buffer circuit 7 to the memory matrix. Correspondingly, a bit which is read out of the memory matrix is directed to the outside via a data output buffer circuit 8 and via the data output $D_o$.

Apart from the memory replacement areas 2, 3, the previously described part of the memory circuit is identical to known circuit elements well known to those skilled in the art. Further details of these memory circuits can thus be taken from the documents for commercially available memory circuits (such as the publication of the Mostek Corp., Carollton, USA "Memory Data Book and Designers Guide", February 1978, Pages 107-116, Integrated Circuit MK4116, incorporated herein by reference). Thus, a more specific discussion regarding this is not necessary. FIG. 2, however, shows another first and second reconfiguration register (replacement circuit address register) 9 or respectively 10 for receiving reconfiguration addresses, that is, the addresses for each defective row and column in the memory main area. Individual defective bit locations which occur less frequently can be replaced row-by-row or column-by-column. The reconfiguration registers 9, 10 also contain so-called validity bits VR and VC which indicate whether substitute switching should be undertaken at all. The latter is important because all possible contents of the reconfiguration registers 9, 10, including those consisting only of binary zeroes, represent addresses for the memory main area and would lead to substitute switching even when these are not at all necessary.

Activatable comparators 11 and 12 are assigned to the reconfiguration registers 9 and 10 by means of the validity bits VR and VC discussed above. Besides the content of the corresponding register, the external address of the memory main area which is adjacent the address inputs is directed to each comparator 11, 12. According to the assumption that a reconfiguration register 9 is assigned to the replacement row and contains the address of a faulty row of the memory main area, it must be assured that the comparator 11 only selects the connected replacement row even in the case of a coincidence of the external address with the address stored in the register 9 when the external address is a row address. This applies correspondingly in the column direction.

This condition is automatically attainable in a memory circuit with parallel input of row and column addresses by means of corresponding wiring. In the case of the organization of a memory circuit which forms the basis here, and which is similar to the organization of the memory MK4116 already designated, it is determined by means of the signals $\overline{RAS}$ and $\overline{CAS}$ accompanying each address input whether a row or column address is present. It is thus practical to couple these signals or, respectively, their inverted values with the validity bits VR and VC according to an AND function, and to use the result of the coupling for the activation of the comparators. If, in agreement with the relationships present in the case of the known memory circuit, one proceeds from the assumption that the signal $\overline{RAS}$ is effective during an entire reading or writing access, and the signal $\overline{CAS}$ only begins after the ending of the row address input, then the couplings apparent in symbolic depiction from FIG. 2 result by means of the AND members 13 (line) and 14 (column). Accordingly, as is normally assumed, the AND condition is fulfilled when all input signals carry the higher binary signal level. At least the comparator 11 for the row addresses must be in the position of storing the results of the comparison since the external row address is only available briefly and soon is replaced by a column address.

If the prerequisites for the activation of a comparator are fulfilled and also the addresses which are offered to it are identical, then the replacement row or column connected with the output of the comparator is selected. Simultaneously, the address decoders 4 and 5 are blocked from the memory main area. This occurs via a NOR member 15 which is connected to all comparator outputs.

The reconfiguration registers 9, 10 should be loadable in bit-serial manner via the data input $D_i$ and also should be readable via the data output $D_o$. For the selection of the individual bit locations of the register, therefore addresses are necessary which are raised (or lowered) step-by-step. The determination of a specific register of two registers 9 and 10 can take place by means of an additional address bit or by means of the signals $\overline{RAS}$ and $\overline{CAS}$. If several replacement rows and columns, and in accordance with this more than two registers are provided, then at least the differentiation between the registers of the same kind must take place via the address. An access to the reconfiguration registers 9, 10 can, because of the address and data paths in common with the memory area, only proceed when the already-mentioned register release signal REGEN is present. The release signal SPEN for the memory area must disappear. The converse correspondingly applies.

Due to the bit-serial external access to the reconfiguration registers 9, 10, it is practical to design these as shift registers whose contents can be interrogated in parallel within the module for the purpose of the address comparison. In this case, the possibility also exists of connecting the two reconfiguration registers 9 and 10 in series when the replacement circuit information is transferred from the read-only memory PROM. One can begin with the bit-by-bit input of the information corresponding to a defective column of the memory main area into the reconfiguration register 9 assigned to the row direction. In the case of the following input of the row information, the column information is pushed further into the column register 10 so that finally the replacement circuit information for row and column are contained in the reconfiguration registers 9 and 10 provided for this purpose in each case. A special addressing of these registers by means of an additional address bit or by means of the signals $\overline{RAS}$ and $\overline{CAS}$ then ceases. The last described variation is depicted in FIG. 2.

The information originally contained only in the read-only memory PROM by means of corresponding programming, or after disconnection of the supply voltage for all memory integrated circuits located on the memory printed circuit board, must be input into the reconfiguration registers 9, 10 of the individual memory circuits before beginning or resuming operation.

Before details of the information transfer are discussed more precisely, first the necessary memory capacity of the read-only memory PROM should be estimated. It is established as explained previously that a memory printed circuit board or module contains 36 memory integrated circuits with in each case 65k bits of memory capacity, for whose internal addressing in each case 8 row address bits and 8 column address bits are utilized. Since for each memory circuit, one row and one column should be replaceable, there results 16 address bits for each memory circuit. In addition, there are also validity bits VR and VC. In the case of 36 memory circuits, this together makes 648 bits. Thus, as a read-only memory, for example a commercially available 256×4 bit TTL-PROM-integrated circuit can be used.

Therefore, a difficulty results since the information from the read-only memory is made available only in 4 bit words on the read data bus RB. However, since it is practical to simultaneously write the equal value bits of the reconfiguration addresses or, respectively the equivalent validity bits into the corresponding registers of all 36 memory circuits, one proceeds in the manner described hereafter.

Nine read-only memory reading cycles proceed one after the other and the read data are intermediately stored in a service processor which is present for servicing and maintenance in modern data processing systems or in the central processor, and which are reformatted in such a manner that from such a system a single 36 bit-wide word arises. This word is input via the common write data bus WB into the memory circuits SD1 through SD36 or, respectively, into their reconfiguration registers.

The process consisting of 9 reading cycles, the reformatting, and the write cycle must still be repeated 17 times until the entire replacement circuit information is written in to all memory circuits of a memory printed circuit board or module. This is also multiplied corresponding to the number of the memory printed circuit boards or modules in a memory system.

It should also be noted that during a read cycle for the read-only memory, the release signal PREN must be present and the release signals SPEN and REGEN may not be effective. Correspondingly, the signal REGEN is effective during the input phase of the reconfiguration information into the memory circuits. It should be further observed that the input of replacement circuit information into the reconfiguration registers 9 and 10 can also take place during running operation with a low priority due to newly occurring faults. Simultaneously, data stored in the fault-containing portions of the memory main areas are carried over into the memory replacement areas. The faults possibly contained in the reading data are then corrected with high probability by the fault-correcting devices associated with the memory.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A semiconductor memory system formed by a plurality of memory modules, each memory module comprising:
   (a) a plurality of integrated semiconductor memory circuits, each of said integrated semiconductor memory circuits having
      (i) a main memory area,
      (ii) a redundant memory area, and
      (iii) circuit means for replacing faulty parts of said main memory area by means of corresponding parts of said redundant memory area, said circuit means having a reconfiguration register means in the form of volatile auxiliary memories for reception and storage of data used for proper functioning of said circuit means for replacing the faulty parts;

(b) a single, non-volatile auxiliary memory means for auxiliary storage of data of all integrated semiconductor memory circuits of the memory module which are required for proper functioning of the semiconductor memory circuit for the replacement of faulty parts of the main memory area in the memory circuit; and (c) said non-volatile auxiliary memory means comprising a programmable read-only memory (PROM);

whereby each of said memory modules is a relatively small and inexpensive exchangeable unit of said semiconductor memory system which can be easily mechanically replaced during normal maintenance work.

2. A semiconductor memory system according to claim 1 wherein the non-volatile auxiliary memory means (PROM) of each memory module is connected both to an address bus as well as to a read data bus, both of said buses being shared by all of the integrated semiconductor memory circuits of the memory module.

3. A semiconductor memory system according to claim 1 wherein said reconfiguration register means realized in the form of volatile auxiliary memories has at least two reconfiguration registers designed as shift registers interrogatable in parallel and which have both a data input connected for serial data input from a data input of the integrated semiconductor memory circuit and a data output connected for serial data output into a data output of the integrated semiconductor memory circuit.

4. A semiconductor memory system according to claim 3 wherein said reconfiguration registers are connected in series, and means are provided for input of said data necessary for the proper functioning of the circuit for replacement of faulty parts of the main memory area in a bit-serially fashion from the data input of said integrated semiconductor memory circuit over the data input of a first of the reconfiguration registers in a shift direction up to a last of the reconfiguration registers, and such that a transition from one reconfiguration register occurs over the data output of a preceding reconfiguration register to the data input of a following reconfiguration register.

5. A semiconductor memory system according to claim 3 wherein in addition to addresses of faulty rows or columns, the reconfiguration registers associated with each of the integrated semiconductor memory circuits also respectively contain an invalidity bit whose value indicates whether the replacement of parts of the main memory area is to be executed by the redundant memory area or not.

6. A method for transferring data contained in a non-volatile auxiliary memory means to individual, integrated semiconductor memory circuits of a respective memory module of a semiconductor memory system, said memory system being formed of a plurality of said memory modules, a data processing system having a processor associated with the memory modules, and each memory module comprising:

(a) a plurality of integrated semiconductor memory circuits, each of said integrated semiconductor memory circuits having
  (i) a main memory area,
  (ii) a redundant memory area, and
  (iii) circuit means for replacing faulty parts of said main memory area by means of corresponding parts of said redundant memory area, said circuit means having a reconfiguration register means formed of at least first and second reconfiguration registers designed as volatile auxiliary memories for reception and storage of data used for proper functioning of said circuit means for replacing the faulty parts;

(b) a single, non-volatile auxiliary memory means for auxiliary storage of data of all integrated semiconductor memory circuits of the memory module which are required for proper functioning of the semiconductor memory circuit for the replacement of faulty parts of the main memory area in the memory circuit;

(c) said non-volatile auxiliary memory means comprising a programmable read-only memory (PROM); said method comprising the steps of:

(a) reading one or more words from said non-volatile auxiliary memory means into said processor of the data processing system which is associated with the respective memory module until a sufficient number of bits are read in order to form a word in this processor having a data width corresponding to a width of an input data interface of the respective memory module;

(b) forming said word in said processor;

(c) transferring said word over the input data interface of the memory module and data inputs of the integrated semiconductor memory circuits of said memory module;

(d) accepting bits present at a data input of each first reconfiguration register of all integrated semiconductor memory circuits of a memory module into this first reconfiguration register upon simultaneous contained shifting of information previously accepted and shifted according to a clock into a next memory location of the reconfiguration register in a shift direction, or given data overflow, into the second reconfiguration register of the same semiconductor memory circuit; and (e) repeating of the steps (a) through (d) until all of said data contained in the non-volatile auxiliary memory means are transferred into all integrated semiconductor memory circuits of the memory module.

* * * * *